FABRICATION OF INTEGRATED MICROCIRCUITS UTILIZING DIELECTRIC-P-N JUNCTION ISOLATION

Filed Nov. 12, 1970

INVENTOR
MANFRED RÖDER 3,725,146
FABRICATION OF INTEGRATED MICROCIRCUITS UTILIZING DIELECTRIC-P-N JUNCTION ISOLATION

Manfred Roder, Dresden, Germany, assignor to Arbeitsstelle fur Molekularelektronik, Dresden, Germany
Continuation-in-part of application Ser. No. 14,794, Mar. 2, 1970, which is a continuation of application Ser. No. 703,756, Feb. 7, 1968, both now abandoned. This application Nov. 12, 1970, Ser. No. 88,963
Int. Cl. H011 5/00, 7/00, 19/00
U.S. Cl. 148—175 3 Claims

ABSTRACT OF THE DISCLOSURE

A semiconductor device for integrated microcircuits having a number of functional elements, includes a semiconductor substratum, a dielectric insulation layer disposed on the substratum, low-ohmic highly doped semiconductive layers located in the regions of respective functional elements. A dielectric insulation layer coats the bottom and side surfaces of the low-ohmic layers, with the thickness of the dielectric insulation layer being greater in the regions between the low-ohmic layer. Semiconductive body layers adjoin the open upper surface of the low-ohmic layers and overlap the periphery of the top surface of the side portions of the dielectric insulation layer. The semiconductive body layers have the same type of conductivity as the low-ohmic layers. P-N junctions disposed on the dielectric insulation layer form lateral insulation frames around respective semiconductive body layers. Third insulating layers are provided on the upper surface of respective functional elements.

Figure 1:
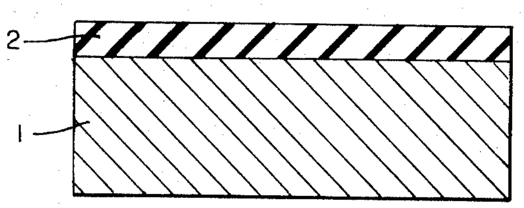
Figure 2:
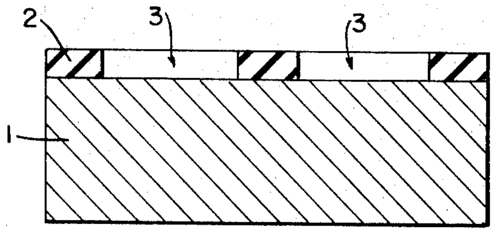
Figure 3:
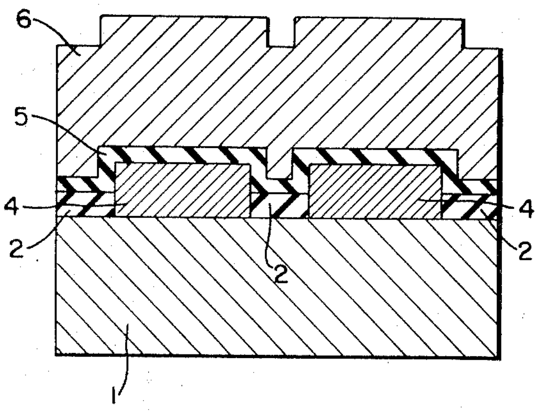

This application is a continuation-in-part of application Ser. No. 14,794 filed Mar. 2, 1970 (now abandoned), which is a continuation of application Ser. No. 703,756 filed Feb. 7, 1968, now abandoned.

This invention relates to a semiconductor device structure for integrated microcircuits such as that employed for logic functions, communications or control devices, and to a method for producing semiconductor devices of this type.

Integrated semiconductor microcircuits as well as various methods of their fabrication are known in the prior art. Nevertheless, the known microcircuits are still arranged in a structure which does not meet all operational requirements. More particularly, difficulties have arisen in the design of collector areas of individual functional elements, and in the electrical separation of these areas. Until now a planar technology has been preferred in the production of integrated semiconductor devices, wherein the desired structures are accomplished by the provision of a plurality of various mating layers in such a manner that respective functional elements which are embedded in a semiconductive block, are electrically insulated from one another.

There are two known modes of providing insulation of respective elements, namely insulation by means of reversed biased P-N junctions, or by means of a dielectric insulation.

To produce the P-N junction insulation, a so called moat-diffusion method, for creating an insulation frame, for example, by a masking diffusion technology, has been employed.

On the other hand, non-conductive layers, such as layers of oxygen or nitrogen compounds of a semiconductive material, are deposited on a semiconductive block to form a dielectric insulation.

Since each of the above mentioned methods exhibits both advantages and disadvantages, it is also possible to unite the two methods into a single method which has been designated as a partial dielectric insulation. The latter has been disclosed, as to the limit conditions, in an article by M. W. Aarens entitled "Integrated Circuit Device and Fabrication Technology" in Semiconductor Products and Solid State Technology 8 (1965) 3, pps. 42–45.

However, the microminiature devices fabricated by the hitherto known methods have the drawback that the insulation frames or moats produced by means of a diffusion, have an insufficient concentration of the doping material on the contacting site of the functional elements. As a consequence, inversion layers occur during the subsequent planar oxidation process which deteriorate the operation of the semiconductor device.

Moreover, the semiconductor block substrate must be removed during the production process at least as deep as the level of the redoped area of the insulation frame, or moat. This removal process is always critical and requires special handling and supervision to preserve the uniform thickness of this area. Further shortcomings of the known methods lie in that the resulting collector path resistance of the functional elements is higher than desired and moreover, the substrate must be coated with a thick insulation layer, which requires a time consuming thermal oxidation process.

SUMMARY OF THE INVENTION

It is therefore, the primary object of this invention to provide an integrated semiconductor structure having improved operational properties, and in which the parasitic capacitance between the N layer and the substrate is considerably reduced.

Another object of the present invention is to simplify fabrication of integrated semiconductor devices and to improve the output of production of these devices.

A further object of this invention is to provide an integrated semiconductor structure having a partial dielectric insulation between respective elements and which is free from inversion layers and which has a lower collector path resistance.

A still further object of the present invention is to provide a dielectric insulation forming process wherein the thermic oxidation step is avoided.

In accord with this invention a semiconductor device having particular utility in integrated microcircuits, comprises a semiconductive substrate and a dielectric layer is disposed on the semiconductive substrate. Low-ohmic layers are located in the regions where the functional elements of the microcircuits are to be located. These low-ohmic layers are insulated from one another by the dielectric layer. Semiconductor body layers mate with the free upper surfaces of the low-ohmic layers and P-N junctions are disposed on the dielectric layer and form lateral insulation frames around the semiconductive body layers.

The invention provides a semiconductor device for integrated microcircuits having a number of functional elements, comprising a semiconductor substrate, a dielectric insulation layer disposed on the substrate, low-ohmic highly doped semiconductive layers located in the regions of respective functional elements, the dielectric insulation layer coating bottom and side surfaces of the low-ohmic layers with the thickness of the dielectric insulation later being greater in the regions between the low-ohmic layer, semiconductive body layers mating the open upper surface of the low-ohmic layers and overlapping the periphery of the top surface of the side portions of the dielectric insulation layer, the semiconductive body layers having the same type of conductivity as the low-ohmic layers, P-N junctions disposed on the dielectric insulation layer and forming lateral insulation frames around respective semiconductive body layers, and third insulating layers provided on the upper surface of respective functional elements.

The present invention further provides a method for making a semiconductor device of the type described above.

Other objects and advantages of the invention will be appreciated and more fully understood with reference to the following detailed description, when considered with the accompanying drawings, wherein:

FIGS. 1 through 5 illustrate in a sectional elevation consecutive fabrication steps of an integrated microcircuit of this invention.

In the drawings, FIG. 1 illustrates a monocrystalline silicon semiconductive body 1 of an N-type conductivity, upon which a thin (about 10 $\mu$m. thick) silicon dioxide ($SiO_2$) layer 2 is produced. According to FIG. 2, apertures 3 are formed through the layer 2, such as by means of an oxide etching and masking technology.

The shape and the location of apertures 3 correspond to the dimensions of the functional elements which are to be arranged within the semiconductive body to form the integrated microcircuit. On the open semiconductive surfaces of the semiconductive body and within apertures 3 a low-ohmic preferably monocrystallic, highly doped N type semiconductive layer 4 (FIG. 3) of about 20 $\mu$m. thickness is precipated. In the following step, still referring to FIG. 3, the entire resulting upper surface is coated in a large area manner with a thin aproximately 5 $\mu$m. non-conductive silicon dioxide ($SiO_2$) layer 5, upon which a relatively thick (approximately 170 $\mu$m.) polycrystalline silicon semiconductive layer 6 is provided in a large area manner by means of a gas phase precipitation process.

Figure 4:
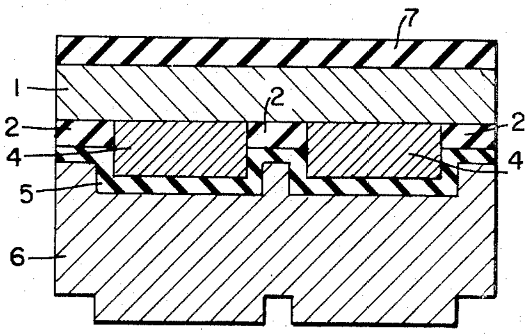

Subsequently, as illustrated in FIG. 4, the whole semi-product is turned about 180° so that the polycrystalline layer 6 becomes a substrate. The semiconductive body 1 is then reduced in thickness to approximately 10 $\mu$m. to form the required height of functional elements. Semiconductive body 1 is then provided with an insulating silicon dioxide ($SiO_2$) layer 7.

Figure 5:
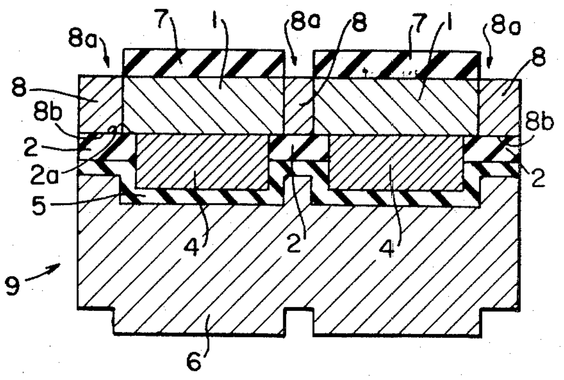

To produce an insulation frame, as shown in cross-section in FIG. 5, the insulating silicon dioxide layer 7 is first removed in regions 8*a* between the functional elements for example by means of a masking and etching process. Portions 8 of the silicon semiconductive body beneath regions 8*a* are redoped, by means of a diffusion process, with boron to form an insulating P-N junction and, consequently, the insulating frame is completed.

To form the completed functional elements, the remnants of the insulating $SiO_2$ layer 7 are utilized for a planar technology and for preparing lead connections. The formation of such elements is well known, and hence is not illustrated in FIG. 5, in order to avoid confusion.

As seen in FIG. 5, the completed structure 9 of the semiconductive device of this invention consists of a semiconductive substrate 6 supporting a low-ohmic layer 4 located in the region and in contact with the bottom surface of each functional element 1. The bottom surfaces 8*b* of the redoped insulating layer portions 8 is reduced with respect to the mating top surface areas 2*a* of the dielectric insulating layers 2. Consequently, the surface of functional elements exceeds the adjacent area of the $N^+$ layer 4. Due to the fact that the side and bottom surfaces of the low-ohmic layer 4 are coated by dielectric insulation layers 2 and 5 and the peripheral area of the N layer of functional elements 1 overlaps the vertical portions of the dielectric insulating layer 5 coating the side portions of the low-ohmic $N^+$ layer 4, the parasitic capacitance between the N layer of functional elements 1 and substrate 6 is thereby reduced and the operational quality of the device improved. More particularly, as shown in the drawings of the invention, especially FIG. 5, the lateral extensions of $N^+$ layers 4 are not as long as the extensions of the corresponding N layers 1. By this means the bottom surfaces as well as the upper surfaces of the $N^+$ layers 4 have been reduced and, consequently, the capacitance between N layers 1 and substrate 6 also has been reduced. Regarding to the dielectric insulation layer it is seen in FIGS. 4 and 5 that the second insulation layer 5 deposited on the first insulation layer 2 in the regions beneath the redoped zones 8 and in part beneath the peripheral regions of the bottom surfaces of the N layers 1 enlarge the vertical extension of the dielectric insulation between the N layers body and the substrate 6.

As pointed out above, both reducing the lateral extensions of the $N^+$ layers as well as enlarging the vertical extension of the dielectric insulation layer in determined regions make it possible to reduce the parasitic capacitance of the semiconductor structure and thereby to improve the operational properties of the structure. On the upper side of the device 9, P-N junctions or portions 8, representing insulation frames surrounding individual doped bodies of the functional elements.

The above disclosed structure 9 and method of its production make it possible to attain a semiconductor device having an increased effectiveness and enable a simple and uniform large scale fabrication. The low-ohmic layer 4 which mates with the semiconductor body 1 of an element, and which is completely insulated around its remaining surface, provides an extremely low collector path resistance.

The reduction of the thickness of the semiconductor body 1 is carried out prior to the creation of the insulation frame so that is is possible by means of a simple measuring method to attain a uniform and most favorable thickness of the respective layers.

The diffusion process for the insulation frame is carried out from the contacting site of the functional element so that, owing to sufficient concentration of the doping material for the subsequent oxidation process, the creation of inversion layers is avoided. At the beginning of fabrication only a planar oxidation process is needed and, therefore, an increased speed may be obtained in the layer forming process.

The foregoing disclosure relates only to a preferred embodiment of the semiconductor device of the invention, which is intended to include all changes and modifications of the example described within the scope of the invention as set forth in the appended claims.

What is claimed is:

1. A method of producing a semiconductor device for integrated microcircuits having a number of functional elements comprising the steps of: creating a first thin non-conductive layer upon one surface of a planar semiconductive body, providing said non-conductive layer with apertures located in the regions of respective functional elements, selectively depositing on the open surface of the semiconductive body in respective apertures, low-ohmic, monocrystalline semiconductive layers, said semiconductive layers being thicker than said non-conductive layer, completely coating the resulting selectively deposited surface including the non-apertured portions of said non-conductive layer in a large area manner with a second thin non-conductive layer, precipitating a thick polycrystalline semiconductive layer upon said second non-conductive layer, reducing the thickness of said planar semiconductive body as deep as to the desired thickness of functional body layers of said functional elements, completely coating the surface resulting from said thickness reducing step with a third non-conductive layer, selectively removing said third non-conductive layer in the regions opposite to the top surface portions of said polycrystalline layer projecting between respective low-ohmic layers, the resulting openings being equal to or less than the surface area of said top surface portions of polycrystalline layer, and diffusing through the resulting open areas in said third non-conductive layer completely thru the semiconductive body down to said first non-conductive layer to produce insulating P-N junction frames between respective functional body layers, the functional body layer being larger in surface area than said low-ohmic layers.

2. The method according to claim 1 wherein said apertures are produced by means of a masking and etching process.

3. The method according to claim 1 wherein said planar semiconductive body is of an N-type silicon and said non-conductive layers are of silicon dioxide.

References Cited

UNITED STATES PATENTS

| | | | |
|---|---|---|---|
| 3,320,485 | 5/1967 | Buie | 317—101 |
| 3,461,003 | 8/1969 | Jackson | 148—175 |

FOREIGN PATENTS

| | | | |
|---|---|---|---|
| 1,421,618 | 11/1965 | France | 148—175 |

OTHER REFERENCES

Maxwell et al.: "Minimization of Parasitics . . . Dielectric Isolation" IEEE Trans. Electron Devices, vol. ED–12, No. 1, January 1965, pp. 20–25.

Wu, P. F.: "Semiconductor Fabrication Process . . . Integrated Devices" I.B.M. Tech. Discl. Bull., vol. 8, No. 12, May 1966, pp. 1846–47.

Stern et al.: "Fabrication of Planar Arrays . . . Insulating Barriers" I.B.M. Tech. Discl. Bull., vol. 7, No. 11, April 1965, p. 1103.

L. DEWAYNE RUTLEDGE, Primary Examiner

W. G. SABA, Assistant Examiner

U.S. Cl. X.R.

29—577; 117—201, 212, 215; 148—174; 317—101, 235 R